United States Patent [19]
Mattord

[11] Patent Number: 6,011,904
[45] Date of Patent: Jan. 4, 2000

[54] MOLECULAR BEAM EPITAXY EFFUSION CELL

[75] Inventor: Terry J. Mattord, Austin, Tex.

[73] Assignee: Board of Regents, University of Texas, Austin, Tex.

[21] Appl. No.: 08/872,758

[22] Filed: Jun. 10, 1997

[51] Int. Cl.[7] .................................................. C23C 14/00
[52] U.S. Cl. ............................................ 392/389; 118/726
[58] Field of Search .............................. 118/726; 392/389

[56] References Cited

U.S. PATENT DOCUMENTS 4,543,467  9/1985  Eisele ...................................... 118/726
5,478,400  12/1995  Shimizu .

FOREIGN PATENT DOCUMENTS 2 534 933A1  4/1984  France .
WO96/19597  6/1996  WIPO .
WO97/06292  2/1997  WIPO .
WO98/51836  11/1998  WIPO .

*Primary Examiner*—Richard Bueker
*Attorney, Agent, or Firm*—Eugene Lieberstein; Michael N. Meller

[57] ABSTRACT

A molecular beam epitaxy effusion cell for growing epitaxial layers upon a semiconductor substrate by control of a collimated beam of molecules generated from a source material in a high vacuum environment in order to control the hyper abrupt stoichiometry of the effusion flux. A heated control assembly is used to control the size of the exit openings of the effusion cell. The control assembly comprises a boroelectric heating member such as a grating having a plurality of holes and a perforated cover which are adjustable relative to one another. The grating includes an internal heating element.

10 Claims, 9 Drawing Sheets

MOLECULAR BEAM EPITAXY EFFUSION CELL

FIELD OF THE INVENTION

This invention relates to the field of molecular beam epitaxy and more particularly to a molecular beam epitaxy effusion cell for growing epitaxial layers upon semiconductor substrates in a molecular beam epitaxy reactor.

BACKGROUND OF THE INVENTION

The band gap characteristics of certain materials such as gallium arsenide and indium phosphides and their ternary and quaternary alloys such as indium-gallium-arsenide-phosphide make them particularly suitable in the fabrication of semiconductors for photonic and optoelectronic applications such as e.g. lasers and diodes. One method of fabrication is to grow one or more layers epitaxially on a single crystal substrate such that the crystal structure of the deposited material effectively constitutes an extension of the crystal structure of the substrate.

Molecular beam epitaxy (MBE) is a known method of epitaxially depositing a single monolayer of high quality and purity material having a crystalline lattice structure which matches that of the substrate. The monolayer is deposited by directing a collimated beam of molecules from a source material onto the substrate in a vacuum environment. The thickness of the layers grown on the substrate can be as thin as one half of an atomic layer in thickness. The beam of molecules are generated in a furnace commonly referred to as a molecular beam epitaxy effusion cell which functions as a sublimator for sublimating source material to the gaseous phase. At present an internally heated crucible with a large exit aperture is used as the furnace of the molecular beam epitaxy effusion cell. The molecular beam is not fully controllable and accordingly instability exists and the coating deposition may lack the desired stoichiometry. These problems are manifested as a result of flux transients due to the inability to control overshooting and undershooting of the molecular beam from the effusion cell. This lack of control over the effusion flux and its dependency upon thermodynamic thermal adjustment affects the hyper abrupt stoichiometry of deposition and has limited the utility of the molecular beam epitaxy (MBE) technique primarily to laboratory applications in favor of other methods of deposition.

SUMMARY OF THE INVENTION

It has been discovered in accordance with the present invention that the performance of the molecular beam epitaxy effusion cell for growing epitaxial layers upon semiconductor substrates can be dramatically improved by eliminating the single large exit aperture of the effusion cell and by using mass flow control instead of thermal adjustment to control the stoichiometry of various flux. This is accomplished in accordance with the present invention by employing a control assembly at the exit opening of the effusion cell comprising a heated member having a multiplicity of small size holes and a mating mask with multiple openings which operate conjointly under the control of an operator to provide heated exit openings for the effusion cell the size of which are variably adjustable. The concept of the present invention eliminates the use of the single large exit aperture and permits adjustable flux control of the molecular beam to eliminate or minimize flux transients.

Broadly the present invention provides a molecular beam epitaxy effusion cell for growing epitaxial layers upon a semiconductor substrate by control of a collimated beam of molecules produced from a solid material source in a high vacuum environment, wherein the effusion cell comprises:

a crucible containing a source of material selected from the elements in 11b to 1Va of the periodic table with said crucible having an open end juxtaposed in relatively close proximity to said semiconductor substrate upon which the epitaxial layers are to be grown, a control assembly for controlling the distribution of flux from said effusion cell, said control assembly including means having a plurality of exit openings spaced from said crucible, means for adjusting the size of said exit openings and means for heating the area surrounding said exit openings.

BRIEF DESCRIPTION OF THE DRAWINGS

The advantages of the present invention will become apparent from the following detailed description of the present invention when read in conjunction with the accompanying drawings of which.

DETAILED DESCRIPTION OF THE INVENTION

Figure 1:
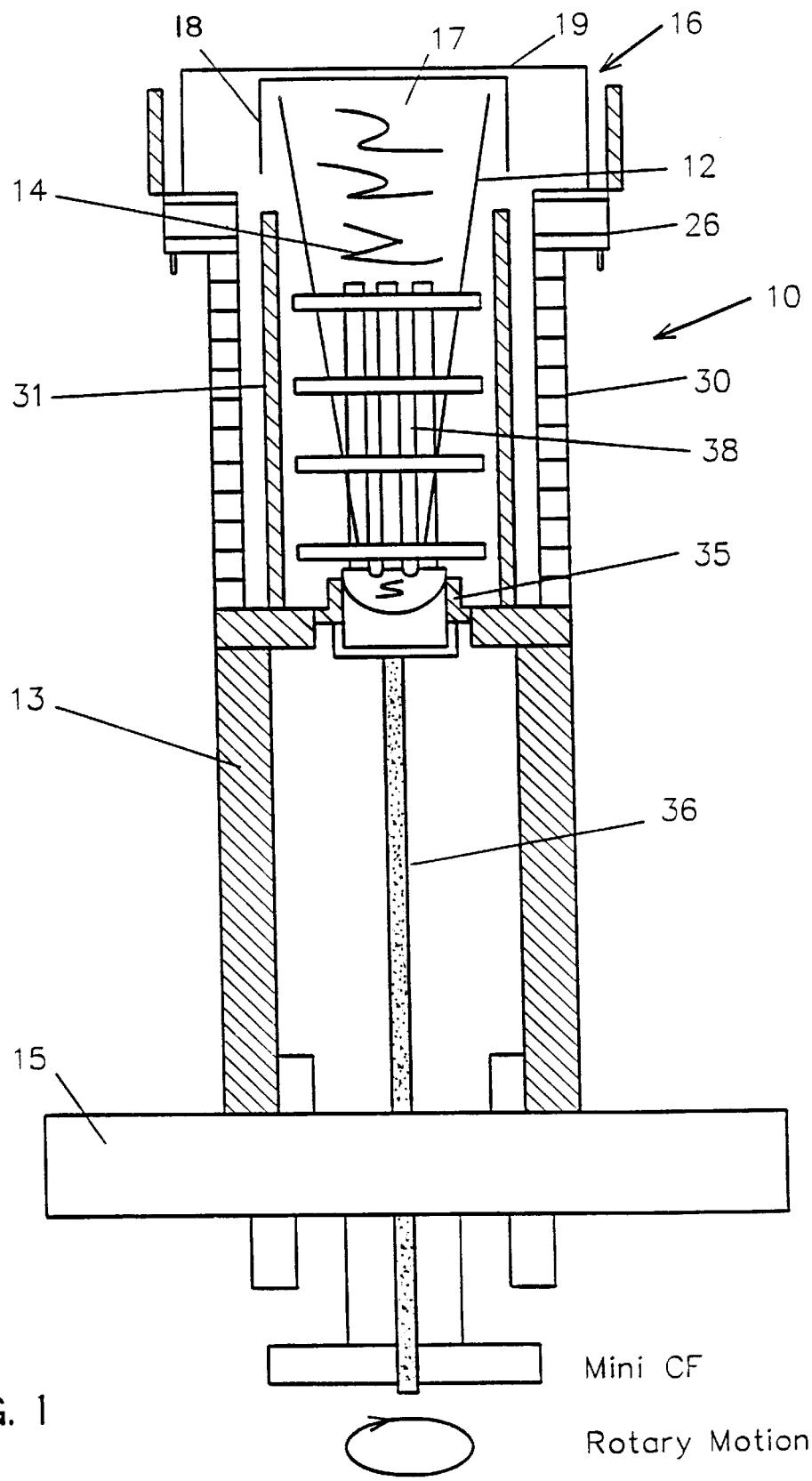
FIG. 1 is a simplified schematic sectional view of the molecular beam epitaxy effusion cell of the present invention.

Referring now to FIGS. 1–4 in which FIG. 1 is a simplified drawing of the preferred embodiment of the molecular beam epitaxy effusion cell 10 of the present invention. The effusion cell 10 includes a crucible 12 for sublimating a source of material 14 placed into the crucible 12. The source of material 14 may be represented by any elemental source material selected from IIa to IVb of the Periodic Chart Of The Elements inclusive of gallium, indium aluminum, tin, lead and mercury which will permit a collimated beam of molecules to be generated for epitaxial formation of a film matrix of e.g. gallium aluminum arsenide, indium phosphide and/or their ternary and quaternary alloys such as indium-allium-arsenide-phosphide or to introduce a controlled dopant into a semiconductor wafer.

The crucible 12 may be of any desired shape and may be composed from any suitable material such as graphite, tantalum, molybdenum and pyrolytic boron nitride. Pyrolytic boron nitride is the preferred material to minimize the potential of unintentional contamination of the epitaxial layers in the growth chamber of the molecular beam epitaxy reactor (not shown). The crucible is secured to a frame 13 connected to a flange 15 for attachment of the effusion cell 10 to the molecular beam epitaxy reactor (not shown). The molecular beam epitaxy reactor (not shown) is evacuated to form an ultra-high vacuum oxygen free environment for the effusion cell 10 to operate in as is well known to those skilled in the art of molecular beam epitaxy.

Figure 2A:
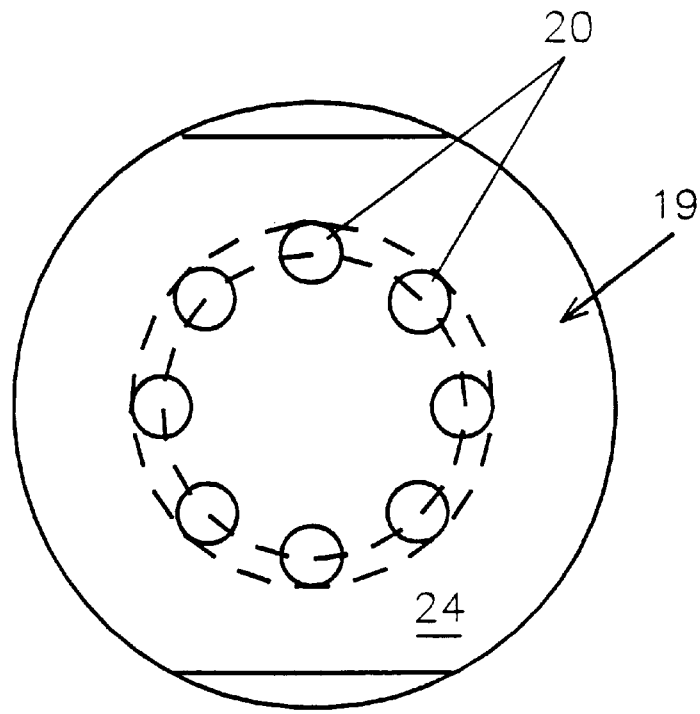
FIG. 2(a) is a plan view of the grating member in the effusion cell control assembly of FIG. 1.
Figure 2B:
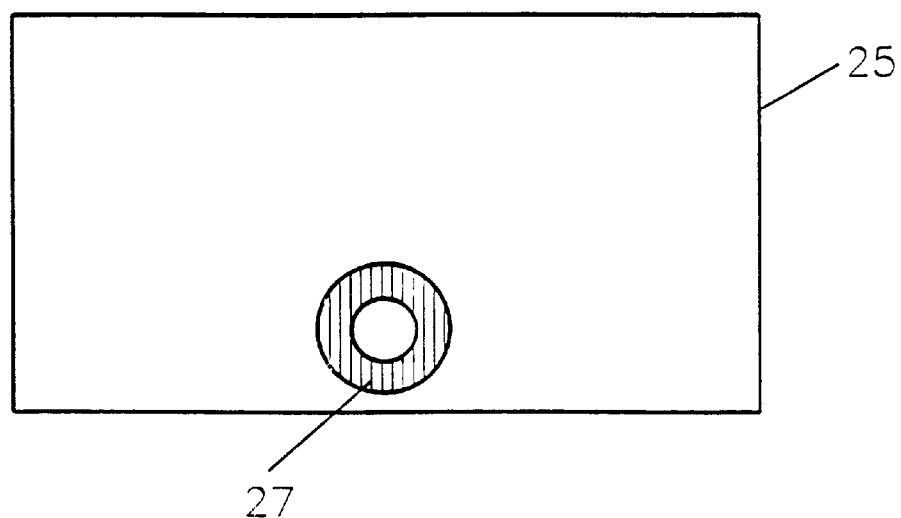
FIG. 2(b) is a side view of the grating member of FIG. 2(a)
Figure 3A:
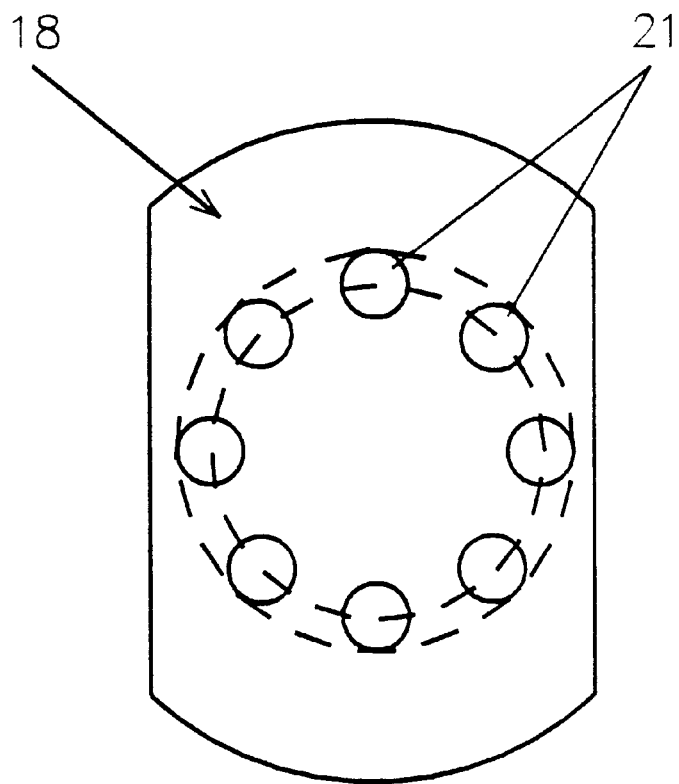
FIG. 3(a) is a plan view of the perforated cover for the crucible of the effusion cell of FIG. 1.
Figure 3B:
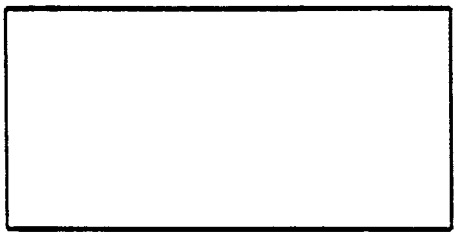
FIG. 3(b) is a side view of the perforated cover of FIG. 3(a)

A control assembly 16 is mounted over the open discharge end 17 of the crucible 12 in relatively close proximity to the substrate (not shown) upon which the epitaxial layers are formed. The control assembly 16 includes a perforated cover 18 which is mounted over the crucible 12 and a grating 19. The grating 19 as is shown in FIG. 2(a) includes a plurality of holes 20 which are preferably arranged to form a circular array. Alternatively, a multiplicity of holes 20 may be formed and arranged in concentric circles as in a "shower head" configuration. A plan view of the perforated cover 18 is shown in FIG. 3(a). The grating 19 is held in a contiguous relationship to the perforated cover 18 with the holes 20 in the grating 19 superimposed over the perforations 21 in the cover 18 so that variable size exit openings are formed upon the relative rotational adjustment of the grating 19 and the perforated cover 18. This becomes clear from FIG. 4 which is illustrative of the relationship between the grating 19 and the cover 18 to vary the size of the exit openings in the grating 19 for the discharge of effusion flux.

Figure 2C:
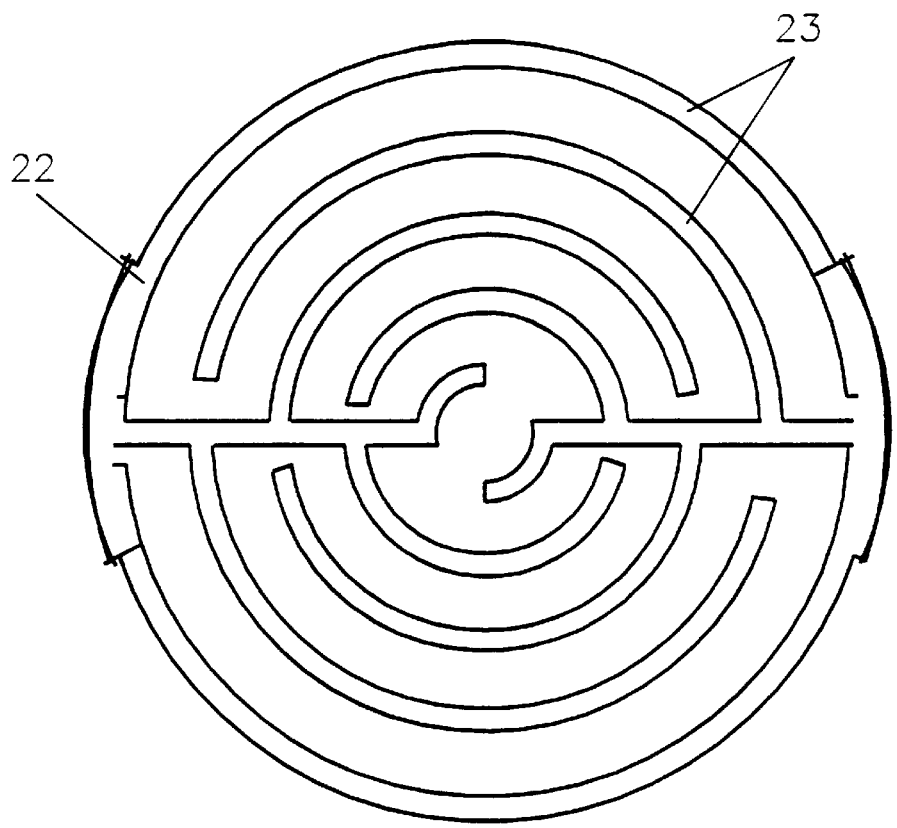
FIG. 2(c) is another plan view of the grating member of FIG. 2(a) with its surface coating removed to expose an internal heating element.
Figure 2D:
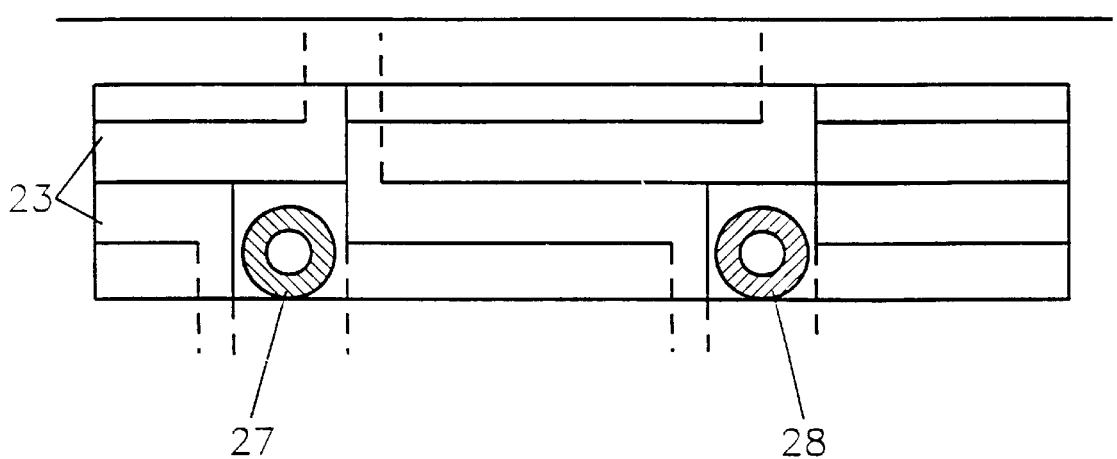
FIG. 2(d) is a layout of FIG. 2(b) showing the pattern of the internal heating element around the side of the grating member.

The perforations 21 in the cover 18 may be of comparable size and number to that of the holes 20 in the grating but need not be. The perforated cover 18 is preferably composed of pyrolytic boron nitride whereas the grating 19 is preferably a composite body represented by a pyrolytic boron nitride body 22 enclosing an internal heating element 23 as shown in FIG. 2c. The internal heating element 23 is preferably composed of pyrolytic graphite and has a predetermined serpentine pattern in close proximity to the holes 20. The grating 19 has a planar surface 24 containing the holes 20 and a depending surface 25 which is mounted in an annular collar 26 of a support column 30 extending from the frame 13 to support the grating 19 over the crucible 12. The grating 19 should preferably be in direct contact with the cover 18. The serpentine pattern of the internal heating element 23 extends around the depending surface 25 of the grating 18 as shown in the layout view of FIG. 2d terminating at two terminal contact locations 27 and 28 respectively for connecting the heating element 23 to a source of external power.

The process for forming pyrolytic boron nitride is conventional and briefly involves introducing vapors of ammonia and a gaseous boron halide in a suitable ratio into a heated furnace reactor at a controlled temperature. The boron nitride is deposited upon a substrate of suitable configuration which readily separates from the boron nitride to form a free standing boron nitride body 22 in any desired geometry with a depending surface 25. A coating of pyrolytic graphite is then deposited over the boron nitride free standing structure and machined to form the heating element 23. A helical winding pattern as shown in FIG. 2c is typical for a heating element. The holes 20 in the grating 18 may also be formed by a machining operation at this time and should be positioned to lie directly adjacent the winding of the heating element 23 so that the holes 20 can be heated to a desired elevated temperature of e.g. 1300° C. The pyrolytic graphite coating may be formed by the pyrolysis of a carbonaceous gas such as methane on the boron nitride free standing structure at an elevated temperature and at a suitable pressure. The internal heating element 23 is preferably coated again with pyrolytic boron nitride to fully encapsulate the heating element 23 except for the exposed areas 27 and 28 representing the terminal connections to the heating element 23. An electrical connection can be made to the terminals 27 and 28 by means of a screw (not shown) connected at the collar 26 to wire leads (not shown) extending through the support column 30 in the frame 13. The support column 30 may be composed of tantalum. A heat shield 31 of tantalum surrounds the crucible 12.

Figure 4:
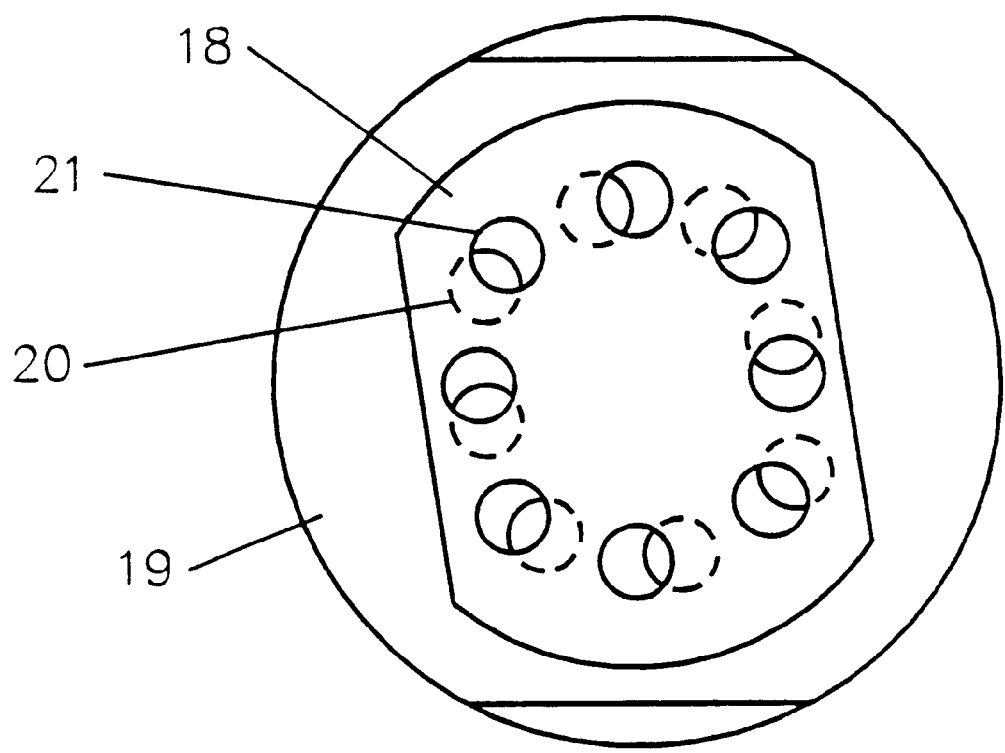
FIG. 4 is a top view schematic diagram of the control assembly for the effusion cell of FIG. 1.

The openings 21 in the cover 18 should have a compatible geometry with the hole pattern 20 in the grating 19. The holes 20 and perforated openings 21 may extend in size from as small as 1 mm to as large as ⅜ inch. The perforated cover 18 is mounted over the lip 32 of the crucible 12 and is intended to rotate with any angular rotatable adjustment of the crucible 12. The crucible 12 need only be adjustable to a limited degree. The concept of the invention is fulfilled by rotatably adjusting the perforated cover 18 relative to the grating 19 so as to control the interdigitation of the openings 21 in the cover 18 relative to the holes 20 in the grating as shown in FIG. 4 with the holes 20 overlapping the perforations 21 thereby providing adjustability to the size of the exit passageways through the grating 19.

The crucible 12 may be supported in a bushing 35, preferably of pyrolytic boron nitride, which is in turn connected to a rotatable shaft 36 permitting the crucible 12 to be manually adjusted by an operator. The crucible 12 is rotatably adjusted about its longitudinal axis. In this arrangement the grating 19 is held in a fixed position by connection to the frame 13 whereas the perforated cover 18 is firmly engaged between the grating 18 and the crucible 12 to rotate in concert with the manual rotation of the crucible 12. It is obvious that the grating 18 may also be made adjustable and/or that the perforated cover 18 may be heated. The invention is also not to be construed as limited to any specific means for rotatably adjusting the relative rotation of the grating 19 and perforated cover 18.

The source material 14 in the crucible 12 may be heated separately by a heating assembly 38 surrounding the crucible 12 to control the sublimation of the source material from solid form to a vapor.

Figure 5:
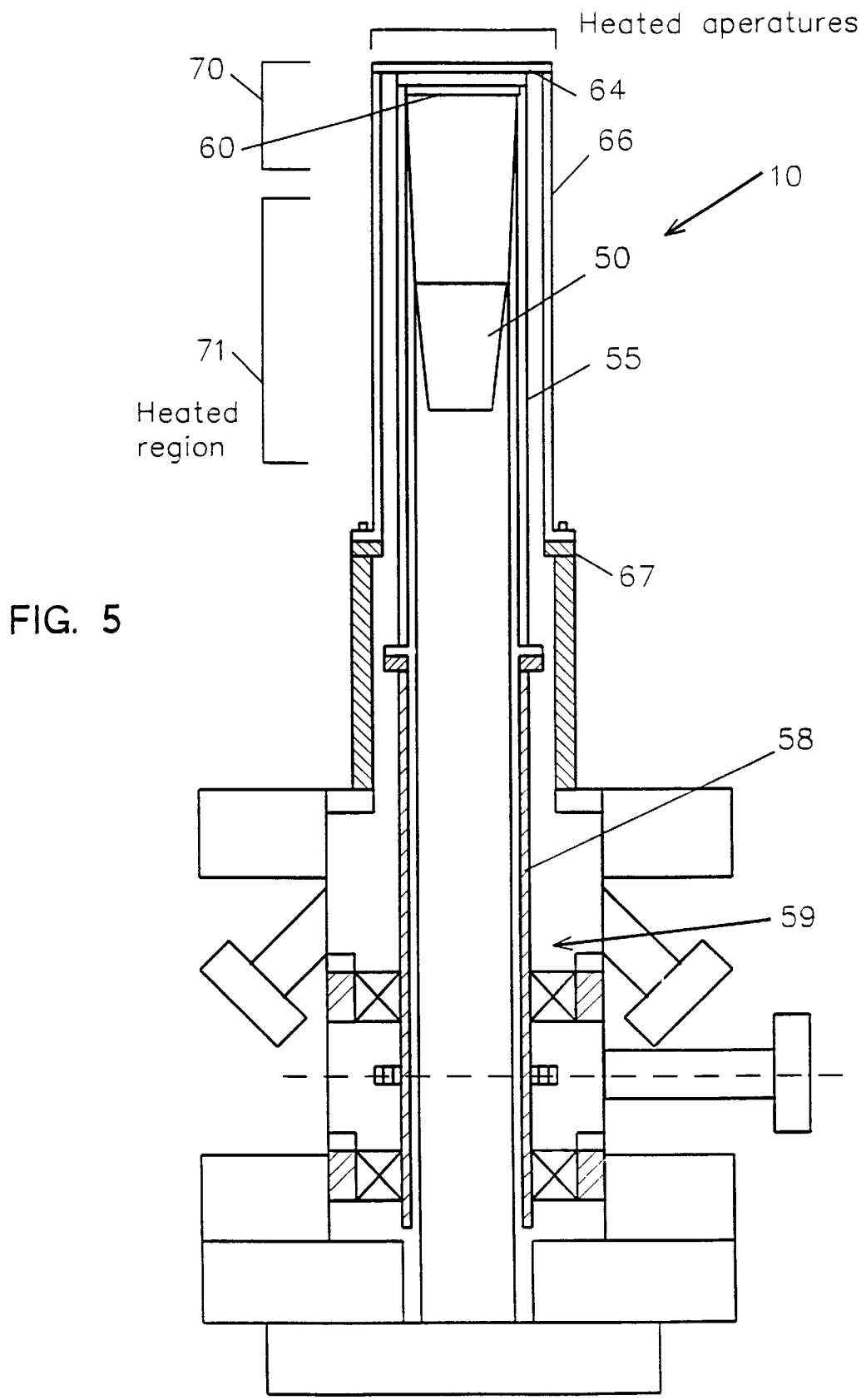
FIG. 5 is a simplified schematic sectional view of another embodiment of the molecular beam epitaxy effusion cell of the present invention.
Figure 6:
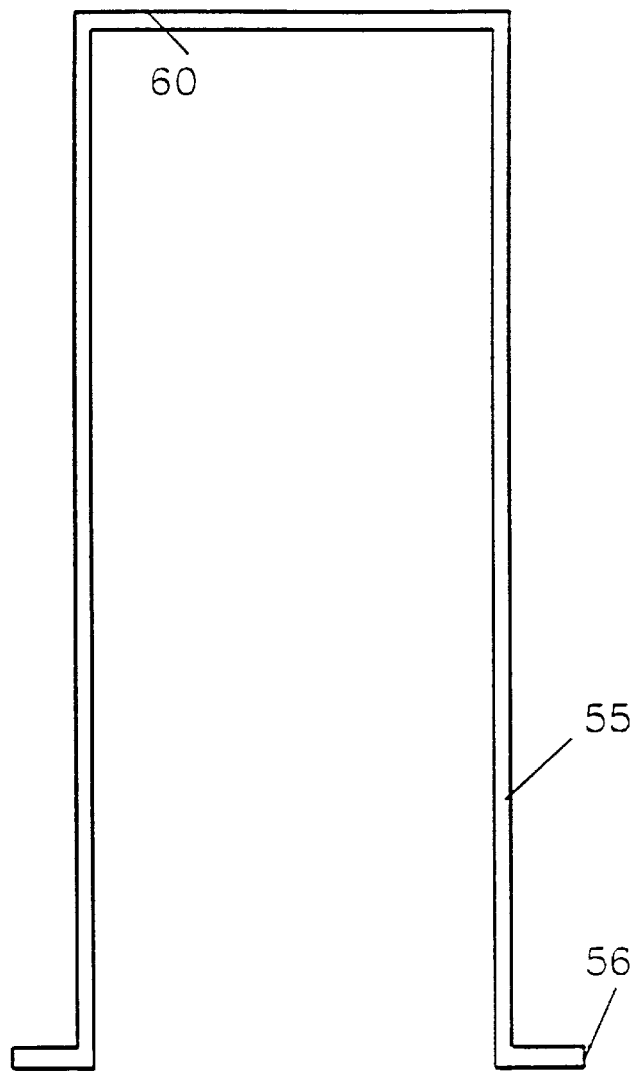
FIG. 6 is a view in cross section of the rotational mask member surrounding the crucible in the molecular beam epitaxy effusion cell of FIG. 5.
Figure 7:
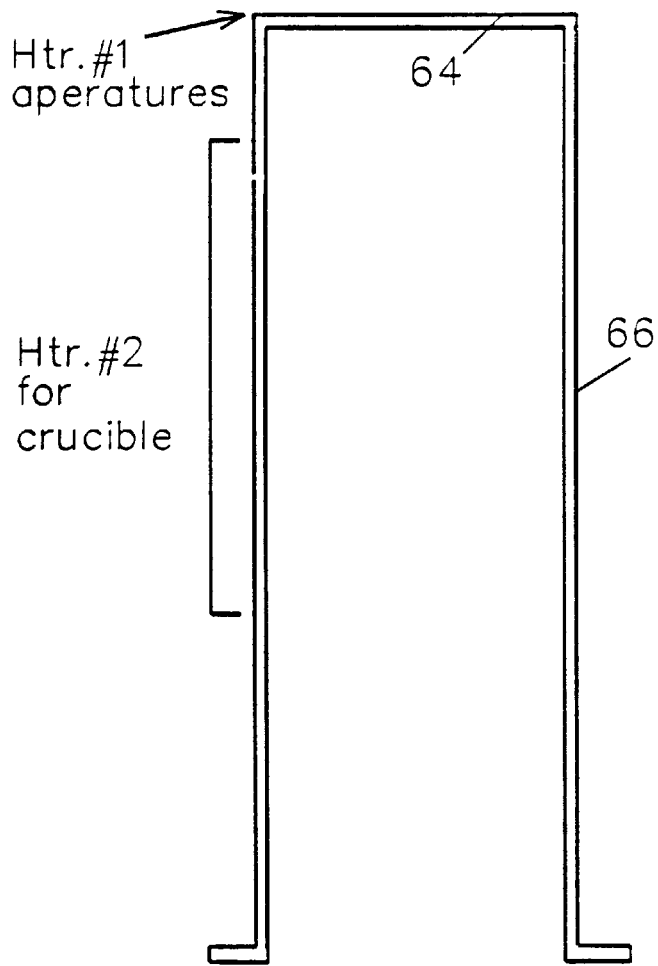
FIG. 7 is a view in cross section of the boroelectric heater shown in FIG. 5.

An alternative embodiment of the molecular beam epitaxy effusion cell 10 of the present invention is shown in FIGS. 5, 6 and 7. The crucible 50 is longer than its counterpart 12 in FIG. 1 and is readily removable from the effusion cell 10. This facilitates the loading of source material (not shown) into the crucible 50 external of the cell 10 and permits the effusion cell 10 to be purified between recharging cycles. The crucible 50 is mounted in an elongated sleeve 52 preferably formed from pyrolytic boron nitride in the shape of a cylinder which extends from a support mandrel 54. The support mandrel 54 is bolted to a vacuum flange 55 for attachment of the effusion cell 10 to a molecular beam epitaxy reactor (not shown) which is evacuated to form an ultra-high vacuum oxygen free environment for the effusion cell 10 as is well known to those skilled in the art.

Figure 6A:
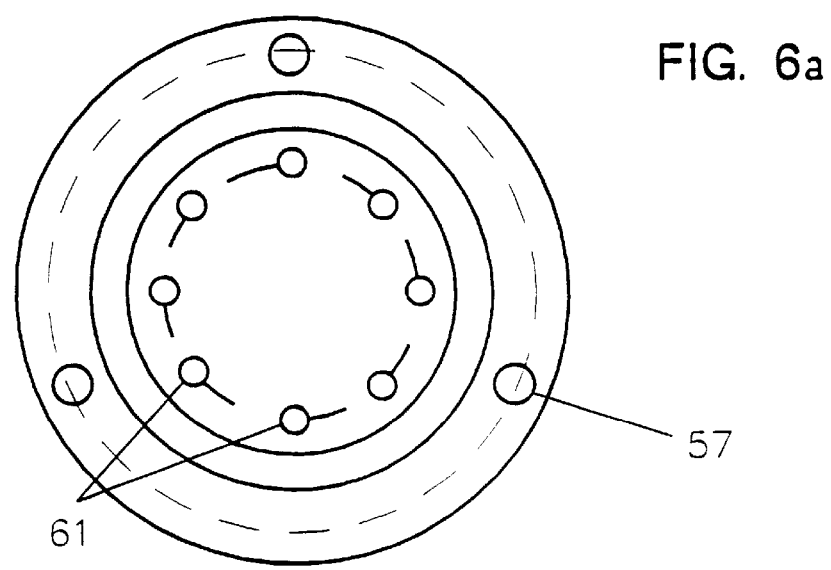
FIG. 6a is a plan view of the aperatured top end of the rotational mask member of FIG. 6.
Figure 7A:
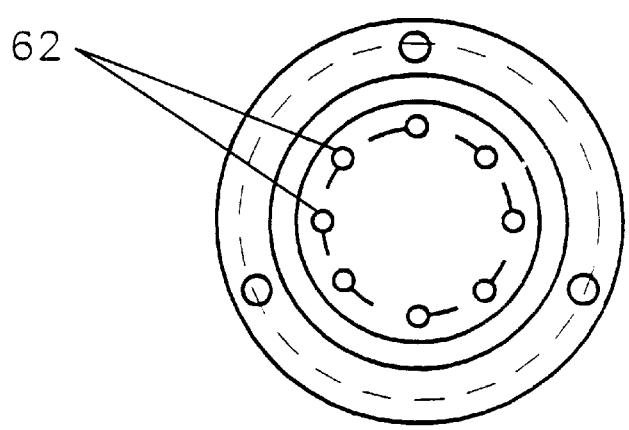
FIG. 7a is a plan view of the upper end of the boroelectric heater of FIG. 5 which is equivalent to the grating member in the effusion cell control assembly of FIG. 1.

In this embodiment the crucible 50 is stationary and is surrounded by a rotational member 55 preferably composed of pyrolytic boron nitride. The rotational member 55 as shown more specifically in FIG. 6 has a body of cylindrical configuration and a flanged end 56 with mounting holes 57 for fixedly mounting the rotational member 55 upon a bearing journal 58 which forms part of a bearing assembly 59. The bearing assembly 59 is adapted to be connected to an external motor (not shown), preferably a stepping motor, for incrementally rotating the bearing journal 57 about the longitudinal axis of the effusion cell 10. This permits the rotational member 55 to be controllably rotated which in turn provides incremental control over the amount of flux generated from the source material in the crucible 50. The rotational member 55 has a top end 60 with a plurality of holes 61 as shown in FIG. 6a for incrementally occluding a plurality of adjacent holes 62 located in the upper end 64 of a boroelectric heater 66 as more clearly shown in FIG. 7 and FIG. 7a. The boroelectric heater 66 surrounds the rotational member 55. The top end 60 of the rotational member 55 functions as the perforated cover 18 of FIG. 1 and the aperatured upper end 64 of the boroelectric heater 66 functions as the grating 19 of FIG. 1. The operational relationship resulting from controlling the occlusion between the holes 61 in the top end 60 and the aperatured upper end 64 is identical to its counterpart operation in FIG. 1. The difference resides in the fact that the rotational member 55 is adjustably rotated between a stationary crucible 50 and a stationary boroelectric heater 66 whereas in FIG. 1 the cover 18 is adjustably rotated by manually rotating the crucible 12.

The boroelectric heater 66 is affixed to a mounting flange 67 supported from the bearing assembly 59 and contains two independent electrical heating filaments (not shown) arranged within the body of the boroelectric heater 66 for independently forming two separate heating regions or zones 70 and 71 with one located adjacent the crucible 50 and the other adjacent the upper end 64. The filaments (not shown) extend through the body of the boroelectric heater 66 to the mounting flange 67 which includes terminal connectors (not shown) to electrically connect the filaments (not shown) to an external power supply (not shown). The boroelectric heater 66 is preferably constructed starting from a pyrolytic boron nitride shell upon which a layer of pyrolytic graphite is deposited by chemical vapor deposition which is then machined into a serpentine geometrical configuration at two separate locations around the boron nitride shell to form two separate electrical filaments extending to the mounting flange 67 for connection to electrical terminals. The filaments correspond in shape and in construction to the electrical filament formed in the grating member 19 as shown in FIG. 2 and as explained earlier on pages 6 and 7. After forming the filaments an outer coating of pyrolytic boron nitride is deposited over the pyrolytic graphite. This procedure is explained on pages 6 and 7.

Figure 8:
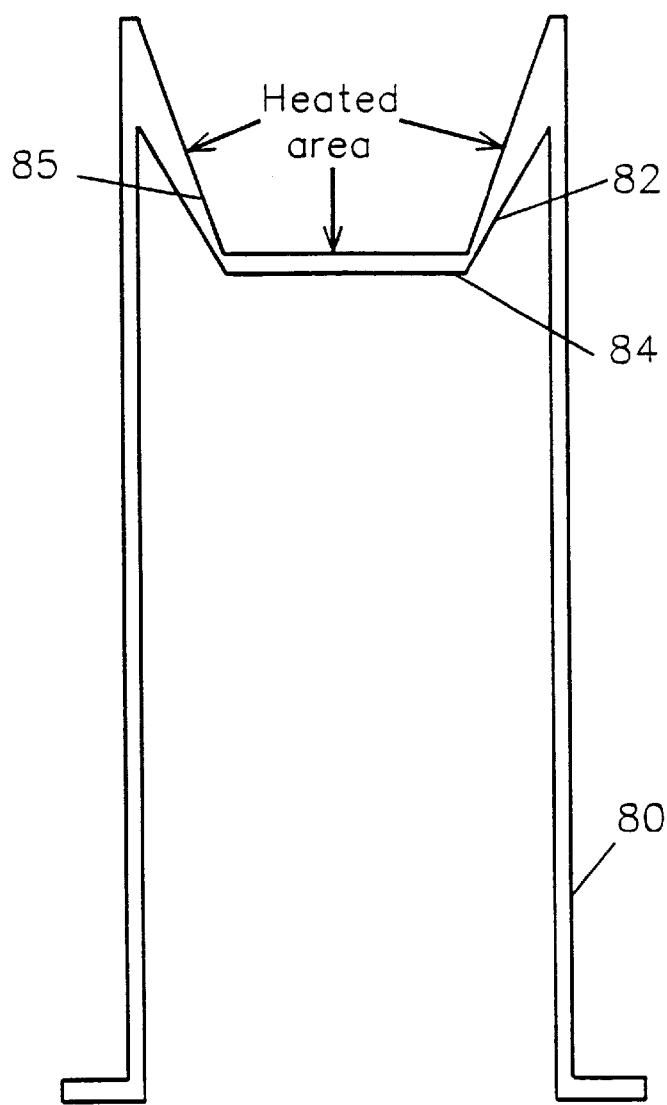
FIG. 8 is a view in cross section of a modified design for the boroelectric heater of FIG. 7.
Figure 8A:
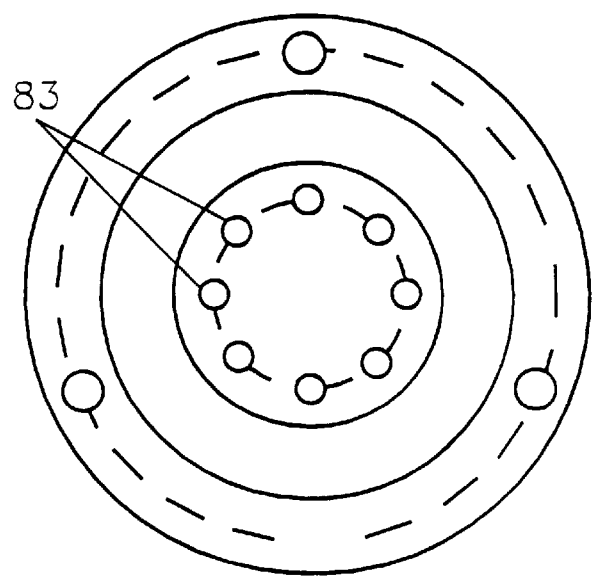
FIG. 8a is a plan view of the upper end of the boroelectric heater of FIG. 8.

Another variation for the boroelectric heater 66 either for the embodiment of FIG. 5 or for the boroelectric heating grating element 19 in the embodiment of FIG. 1 is shown in FIGS. 8 and 8a. The boroelectric heating element 80 is preferably constructed as a composite of layers of pyrolytic boron nitride separated by layer(s) of pyrolytic graphite machined into separate electrical filaments to provide one or more heated regions or zones adjacent to the source material in the crucible and the aperatured exit holes of the heating element. The body of the boroelectric heating element 80 as shown in FIG. 8 has a cylindrical shape terminating in an upper end 82 which includes an array of apertures 83 as shown in FIG. 8a. The shape of the upper end is truncated into a flat section 84 containing the apertures 83 and a sloped section 85. The sloped section 85 is heated along its sloped surfaces by embedding an electrical filament along the sloped surfaces. Flux generated from the source material in the crucible of the effusion cell 10 will exit the apertures 83. Some of the flux molecules will bounce off the sloped section 85 to provide control in collimating the flux and in increasing flux uniformity.

What is claimed is:

1. A molecular beam epitaxy effusion cell for growing epitaxial layers upon a semiconductor substrate by control of a collimated beam of molecules generated from a source material in a high vacuum environment, wherein the effusion cell comprises:

a crucible containing a source of material selected from the elements in 11b to 1Va of the periodic table with said crucible having an open end juxtaposed in relatively close proximity to said semiconductor substrate upon which the epitaxial layers are to be grown, and a control assembly for controlling the distribution of flux from said effusion cell, said control assembly comprising means having a plurality of exit openings spaced from said crucible including a perforated cover for said crucible, a grating having a plurality of holes located adjacent to said perforated cover, means for rotatably adjusting said perforated cover relative to said grating so as to adjust the size of said exit openings and means for heating the area surrounding said exit openings.

2. A molecular beam epitaxy effusion cell as defined in claim 1 wherein said grating is composed of a pyrolytic boron nitride body and includes said means for heating said areas surrounding said exit openings such that said exit openings remain substantially unheated.

3. A molecular beam epitaxy effusion cell as defined in claim 2 wherein said means for heating said areas surrounding said exit openings is a heating element substantially enclosed by said pyrolytic boron nitride body.

4. A molecular beam epitaxy effusion cell as defined in claim 3 wherein said heating element is composed of pyrolytic graphite and has a spiral geometry.

5. A molecular beam epitaxy effusion cell as defined in claim 1 wherein said control assembly comprises a first member surrounding said crucible and having a substantally flat end with a plurality of holes spaced from the crucible in the path of the flux generated from the crucible, a second member surrounding said first member with the second member having an end with a plurality of holes in juxtaposed alignment with the flat end of the first member and means for controllably rotating said first member relative to said crucible and second member.

6. A molecular beam epitaxy effusion cell as defined in claim 5 wherein said means for controllably rotating said first member is located external of said effusion cell and is motorized.

7. A molecular beam epitaxy effusion cell as defined in claim 5 wherein said crucible is removably mounted to said effusion cell such that the crucible is readily removed for recharging the cell and for purifying the effusion cell.

8. A molecular beam epitaxy effusion cell as defined in claim 7 wherein said end in said second member represent the discharge end of the effusion cell and further comprising heating means for heating two separate regions of said second member with one of said regions adjaent to the holes in said discharge end and the other region adjacent to said crucible.

9. A molecular beam epitaxy effusion cell as defined in claim 8 wherein said discharge end of said second member is substantially flat in geometry.

10. A molecular beam epitaxy effusion cell as defined in claim 8 wherein said discharge end of said second member has a truncated geometry.

* * * * *